United States Patent [19]

Norte et al.

[11] Patent Number: 5,892,412
[45] Date of Patent: Apr. 6, 1999

[54] METHOD OF AND AN APPARATUS FOR TUNABLE PASSIVE-GAIN EQUALIZATION

[75] Inventors: David A. Norte; Woong K. Yoon, both of Westminster, Colo.

[73] Assignee: Lucent Technologies Inc., Murray Hill, N.J.

[21] Appl. No.: 804,162

[22] Filed: Feb. 20, 1997

[51] Int. Cl.⁶ .................................................. H01P 1/215
[52] U.S. Cl. ..................... 333/28 R; 333/24.1; 333/81 A
[58] Field of Search .................................. 333/1.1, 24.1, 333/102, 28 R, 185, 12, 161, 81 R, 81 A; 336/175; 375/229

[56] References Cited

U.S. PATENT DOCUMENTS

| | | | |
|---|---|---|---|
| 3,289,110 | 11/1966 | Weiss | 333/24.1 |
| 3,539,950 | 11/1970 | Freibergs | 333/161 |
| 3,550,099 | 12/1970 | Stein | 336/175 X |
| 3,568,100 | 3/1971 | Tarbos | 333/18 |
| 3,740,675 | 6/1973 | Moore et al. | 333/205 |
| 3,838,363 | 9/1974 | Schilz | 333/24.1 |
| 3,921,105 | 11/1975 | Brgelz | 333/28 R |
| 4,173,742 | 11/1979 | Lehmann | 333/12 X |
| 4,283,692 | 8/1981 | Adam | 333/81 A |
| 4,314,288 | 2/1982 | Gyi | 360/65 |
| 4,490,692 | 12/1984 | Schorr | 333/28 R |
| 4,636,752 | 1/1987 | Saito | 333/12 |
| 4,706,017 | 11/1987 | Wilson | 336/175 X |
| 4,716,389 | 12/1987 | Gawronski et al. | 333/81 A |
| 4,717,994 | 1/1988 | Diaz et al. | 363/21 |
| 4,853,802 | 8/1989 | Kukson et al. | 360/65 |
| 4,875,029 | 10/1989 | Guscott et al. | 340/567 |
| 4,964,013 | 10/1990 | Kitagawa | 333/81 A |
| 5,121,088 | 6/1992 | Heinlein | 333/28 R |
| 5,163,173 | 11/1992 | Casagrande | 323/335 |
| 5,200,720 | 4/1993 | Yi | 333/181 |
| 5,274,339 | 12/1993 | Wideman et al. | 330/54 |
| 5,285,175 | 2/1994 | Edwards | 333/109 |
| 5,450,486 | 9/1995 | Maas et al. | 379/399 |
| 5,694,103 | 12/1997 | Goodwin et al. | 336/175 X |

*Primary Examiner*—Paul Gensler
*Attorney, Agent, or Firm*—David Volejnicek

[57] ABSTRACT

A passive positive-gain equalizer comprises a ferrite (100, 300) electromagnetically coupled to a single conductor (111, 311) of a digital signal defined in the frequency domain by a plurality of frequencies. Although it has no external power source other than the digital signal, the equalizer amplifies some of the signal's frequencies. In one embodiment, the equalizer (100) comprises a "C"-shaped body portion (101) whose legs (103, 104) extend through holes in a PC board (110) to be spanned by an "I"-shaped body portion (102). A tunnel (106) formed thereby surrounds a stripline (111) and the PC board portion (112) which carries the stripline. In another embodiment, the equalizer (300) comprises an "E"-shaped body portion (301) whose legs (303–305) extend through holes in a PC board (310) to be spanned by an "I"-shaped body portion (302). A pair of tunnels (306, 307) is formed thereby, and the stripline (311, 511) loops through each of the tunnels one or more times. The equalizer is tunable over a range of frequencies by varying the length or the number of the tunnels, by varying the number of loops the stripline makes through the tunnels, or by varying the number of the equalizers (300, 311) that are cascaded in series on the stripline (1211). Performance is improved by coupling a ferrite choke (800) in series with the stripline (111, 311) at the final output of the digital signal from the equalizer.

27 Claims, 7 Drawing Sheets

METHOD OF AND AN APPARATUS FOR TUNABLE PASSIVE-GAIN EQUALIZATION

TECHNICAL FIELD

This invention relates to amplitude equalization schemes.

BACKGROUND OF THE INVENTION

An amplitude equalizer is a device that compensates for an undesired amplitude-frequency characteristic of a system or a device. An amplitude equalizer may be either active or passive. An active equalizer requires an external source of power, i.e., a source other than the signal that is being equalized, while a passive equalizer does not require an external power source. While it is known that an active equalizer can provide gain (i.e., an amplitude gain greater than 0 dB) to frequencies of the signal that are being equalized, a passive equalizer is known to provide a loss, an attenuation (i.e., an amplitude gain less than 0 dB), to frequencies of the signal that are being equalized. Some equalizers are also known to be tunable, that is, their amplitude-frequency characteristic can be adjusted, or changed, by resizing (physically and/or electrically) their components.

The transmission distance and operating bit-rate for any digital bit-rate system are limited by the bandwidth of the transmission channel used to transport the information to its desired destination. The limited transmission channel bandwidth has the effect of distorting and dispersing the pulse shape that is used to represent the digital information. This distortion has the effect of causing successive transmitted bit pulses to interfere with each other. This interference is commonly referred to as intersymbol interference (ISI) and has the deleterious effects of (1) limiting the transmission distance, (2) limiting the operating bit-rate, and (3) compromising the robustness of the received bit stream. All three of these deleterious effects can be mitigated by incorporating an amplitude-equalization scheme that counteracts these effects. However, it is difficult to find such a scheme which has a positive effect on all three of the deleterious effects yet which is not costly to implement, and which preferably is passive, tunable, and suitable for mounting on a printed circuit (PC) board via automated PC-board assembly techniques.

SUMMARY OF THE INVENTION

According to the invention, a technical advance in the amplitude-equalization art is achieved by the use of a structure made of a ferrite material to function as a passive-gain equalizer for digital signals. According to one aspect of the invention, an amplitude equalizer comprises a ferrite configured for electromagnetically (more specifically, magnetically) coupling to a single conductor of digital signals defined by a plurality of frequencies. The ferrite requires no external power source, other than the digital signal being equalized. The ferrite attenuates some of the signal's frequencies while amplifying other portions of the signal's frequency spectrum. The ferrite thus forms a passive positive-gain equalizer for a digital signal. The equalizer advantageously increases the transmission distance and/or operating bit-rate as well as the robustness of the transmitted digital signal bit stream. Yet the equalizer is inexpensive to make and to use.

According to another aspect of the invention, the amplitude equalizer comprises a ferrite body that defines a tunnel therethrough, and a single conductor of the digital signal that extends through the tunnel. The equalizer is advantageously tunable over a frequency range by varying the length of a portion of the conductor that is electromagnetically coupled to the ferrite body, such as by varying the length of the tunnel. The amplitude equalizer is suited for use with striplines defined by PC boards: both the stripline and a portion of the PC board which defines the stripline pass through the tunnel. The ferrite body advantageously comprises a substantially "C"-shaped first ferrite body portion for being positioned on one side of the PC board and defining a pair of legs for extending through holes defined by the PC board to the other side of the PC board, and a second ferrite body portion that spans (i.e., abuts on and couples together) the legs on the other side of the PC board. The amplitude equalizer so configured is suited for mounting on a PC board via conventional automated PC-board assembly techniques. Performance of the equalizer is improved by coupling a ferrite choke to the conductor at the output of the digital signal from the ferrite body.

According to yet another aspect of the invention, the amplitude equalizer comprises a ferrite body that defines at least a pair of substantially parallel tunnels therethrough, and a single conductor of the digital signals that extends at least once through each of the tunnels in a same direction through each individual said tunnel and in opposite directions through adjacent different said tunnels. The equalizer is advantageously tunable over a frequency range by varying the length of a portion of the conductor that is electromagnetically coupled to the ferrite body, such as by varying either the length of the tunnels or the number of passes of the conductor through the tunnels or the number of the ferrite bodies that are cascaded in series on the conductor. The amplitude equalizer is suited for use with striplines (conductors of the PC board) defined by PC boards: both the stripline and portions of the PC board which define the stripline pass through the tunnels. The ferrite body advantageously comprises a substantially "E"-shaped first ferrite body portion for being positioned on one side of the PC board and defining a trio of legs for extending through holes defined by the PC board to the other side of the PC board, and a second ferrite body portion that spans the legs on the other side of the PC board. The amplitude equalizer so configured is suited for mounting on a PC board via conventional automated PC-board assembly techniques. The cascaded configuration is particularly suited for use with single-layer single-sided PC boards, because it avoids the need for the stripline to cross itself. Performance of the equalizer is improved by coupling a ferrite choke to the conductor at the final output of the digital signal from the ferrite body or cascade of ferrite bodies.

These and other advantages and features of the invention will become more apparent from the following description of illustrative embodiments of the invention taken together with the drawing.

BRIEFF DESCRIPTION OF THE DRAWING

DETAILED DESCRIPTION

Figure 1:
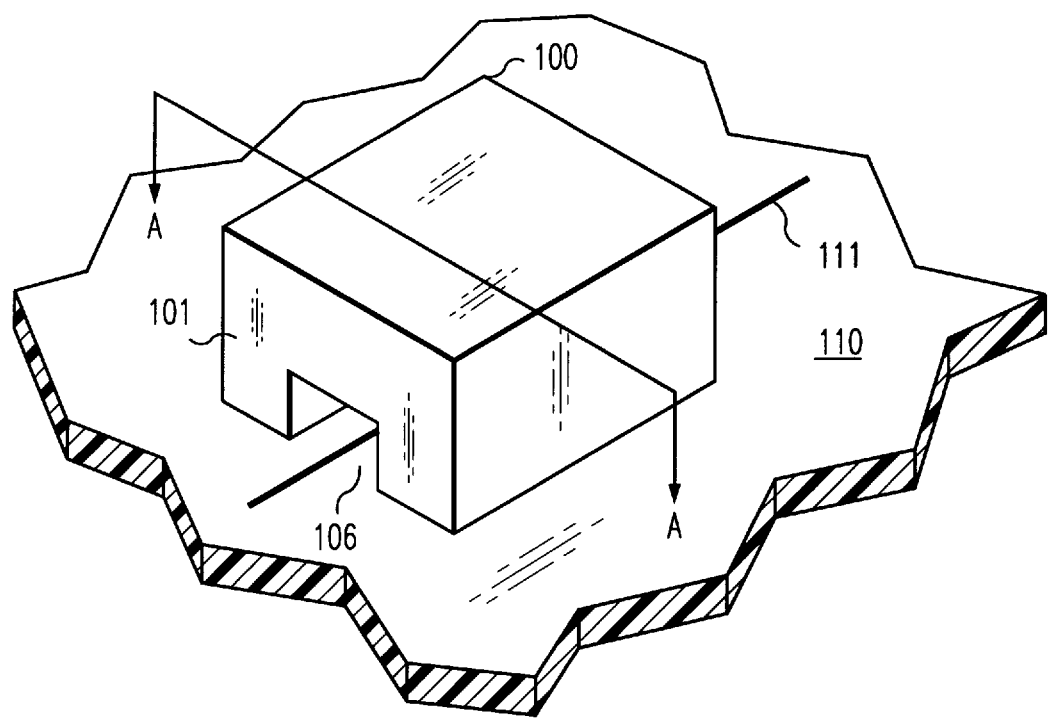
FIG. 1 is a perspective view of a first embodiment of a PC board-mounted passive-gain equalizer constructed according to the invention.
Figure 2:
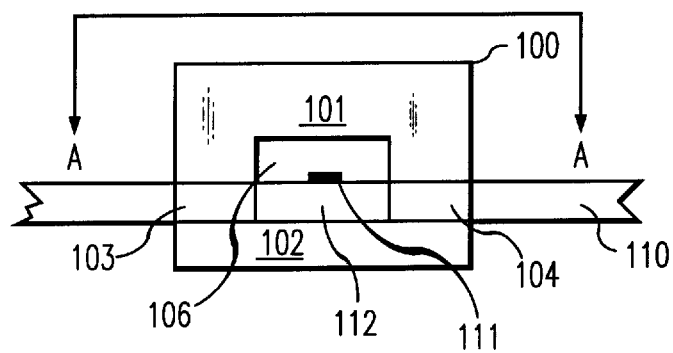
FIG. 2 is a cross-sectional view of the equalizer of FIG. 1.

FIGS. 1 and 2 show a PC board-mounted passive-gain equalizer 100 characterized by "C-I"-shaped planar magnetic structures and a single-pass stripline routing pattern. Equalizer 100 is made of any desired power-transforming ferrite ceramic material, such as nickel-zinc (NiZn) or manganese-zinc (MnZn)-based materials. Suitable materials illustratively include the manganese-zinc materials 3C85, 3F3, and 3F4 of Phillips Components of The Netherlands. Other lossless ferrites, both conductive and non-conductive, may be used as well. Equalizer 100 comprises a portion 101 having a "C" shape in cross-section and a portion 102 having an "I" shape (flat) in cross-section. Equalizer 100 can alternatively comprise two "C"-shaped portions. Portion 101 is mounted to one side of a PC board 110 over a stripline 111 which carries a digital signal defined (in the frequency domain) by a plurality of frequencies. Portion 102 is mounted to the other side of PC board 110 underneath portion 101. Legs 103 and 104 of portion 101 extend through rectangular holes in PC board 110 to portion 102 on the other side of PC board 110. Portion 102 spans (abuts on and couples together) legs 103 and 104. The assembled equalizer 100 thus has a "D" shape in cross-section that defines a passageway or tunnel 106 through which extend both stripline 111 and that portion 112 of PC board 110 which carries stripline 111. Even though equalizer 100 has no external source of power (other than the digital signal carried by stripline 111), it attenuates some and amplifies other of the frequencies that define the digital signal, so that it performs a passive-gain equalization function. Equalizer 100 is tuned within a range of frequencies by varying the length of tunnel 106.

Figure 3:
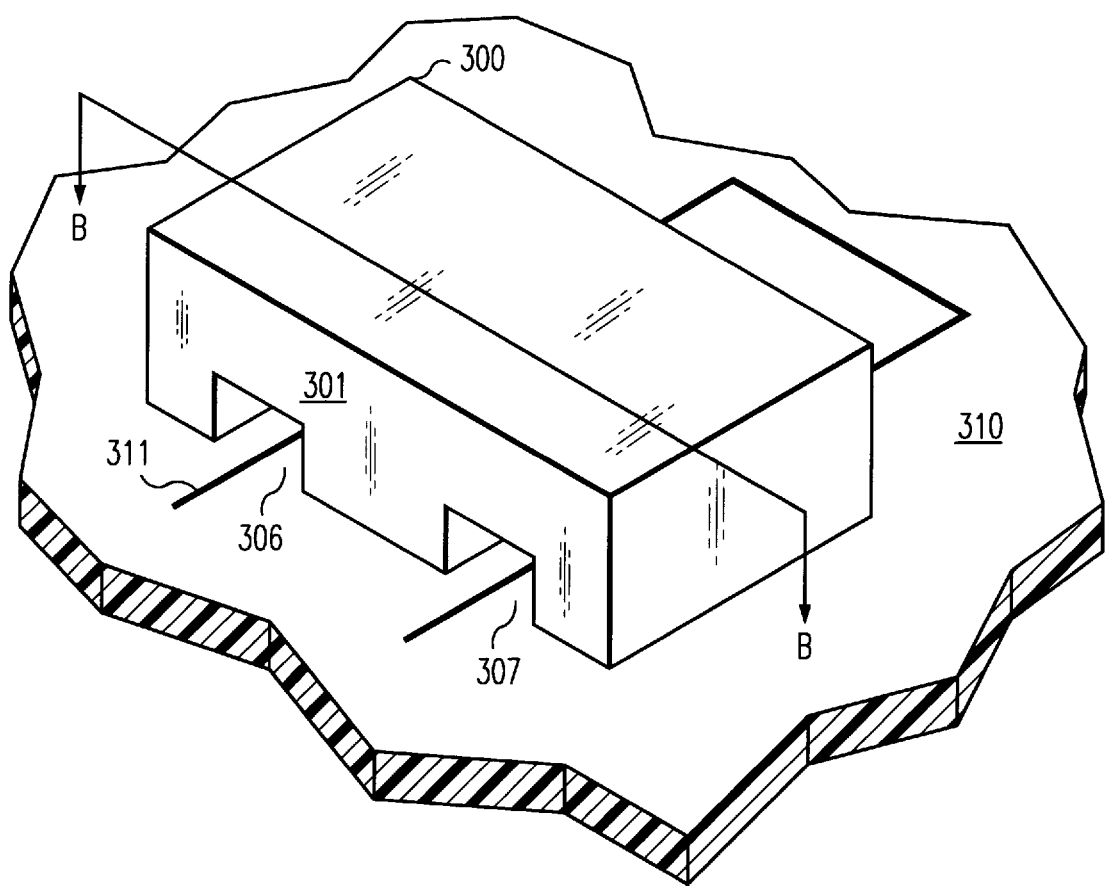
FIG. 3 is a perspective view of a second embodiment of a PC board-mounted passive-gain equalizer constructed according to the invention.
Figure 4:
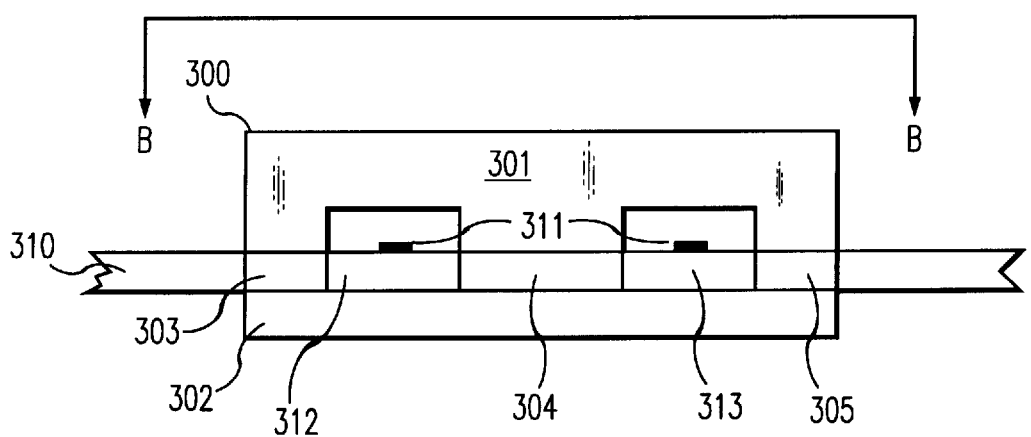
FIG. 4 is a cross-sectional view of the equalizer of FIG. 3.

FIGS. 3 and 4 show a PC board-mounted passive-gain equalizer 300 characterized by "E-I" shaped planar magnetic structures and a double-pass stripline routing pattern. Equalizer 300 comprises a portion 301 having an "E" shape (a trident shape) in cross-section and a portion 302 having an "I" shape (flat) in cross-section. Equalizer 300 can alternatively comprise two "E"-shaped portions. Also, equalizer 300 may be formed by placing a pair of equalizers 100 in abutment with each other. Portion 301 is mounted to one side of a PC board 310 over a stripline 311, and portion 302 is mounted to the other side of PC board 310 underneath portion 301. Legs 303, 304, and 305 of portion 301 extend through rectangular holes in PC board 310 and are spanned by portion 302. The assembled equalizer thus has a figure-8 shape that defines two passageways or tunnels 306 and 307 that encircle stripline 311. Stripline 311 is routed by PC board 310 in a step-function (a "U"-shaped) pattern between tunnels 306 and 307 and winds through both tunnels 306 and 307 in opposite directions, so that both the self- and mutual-magnetic couplings between the portions of the conductors passing through the tunnels provides the equalization function. Both stripline 311 and the portions 312 and 313 of PC board 310 which route stripline 311 in opposite directions extend through tunnels 306 and 307 and are surrounded by equalizer 300. Equalizer 100 is tuned within a range of frequencies by varying the length and/or the number of tunnels 306–307.

Figure 5:
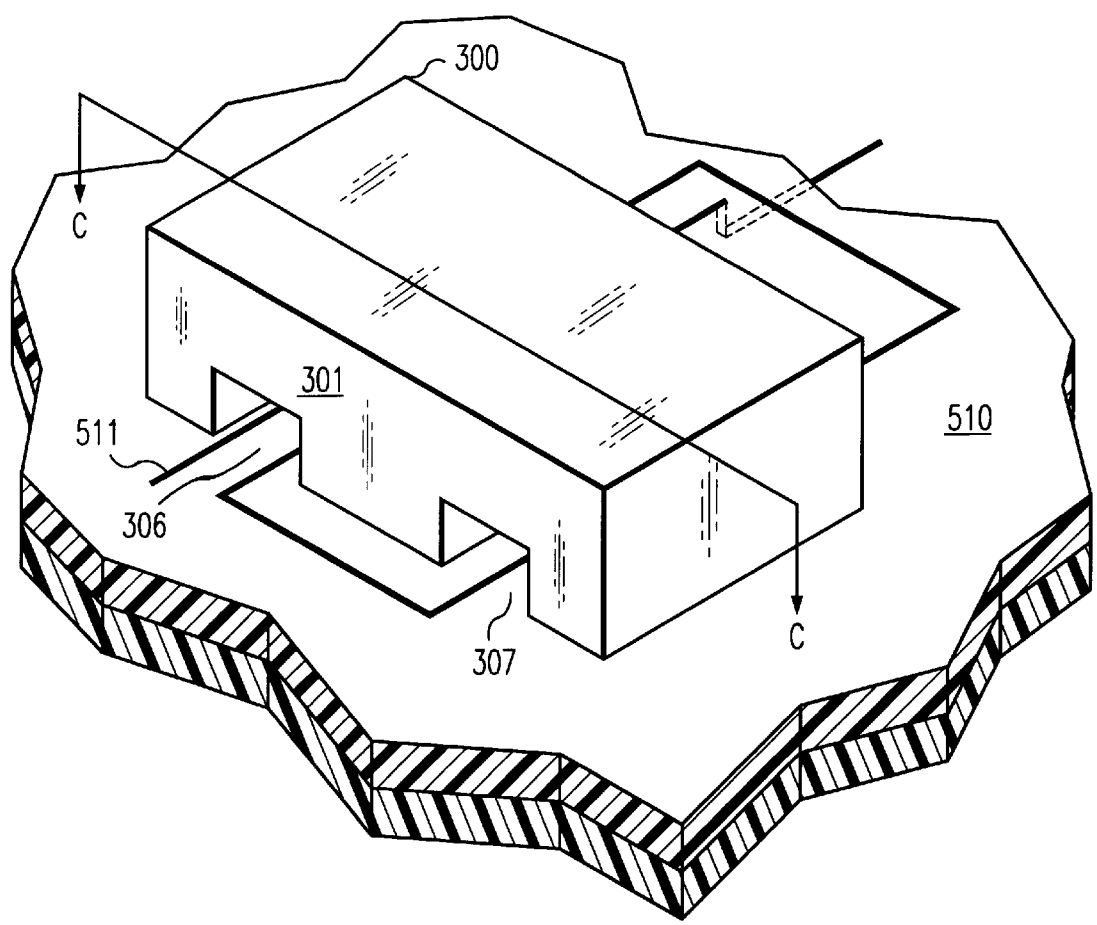
FIG. 5 is a perspective view of a third embodiment of a PC board-mounted passive-gain equalizer constructed according to the invention.
Figure 6:
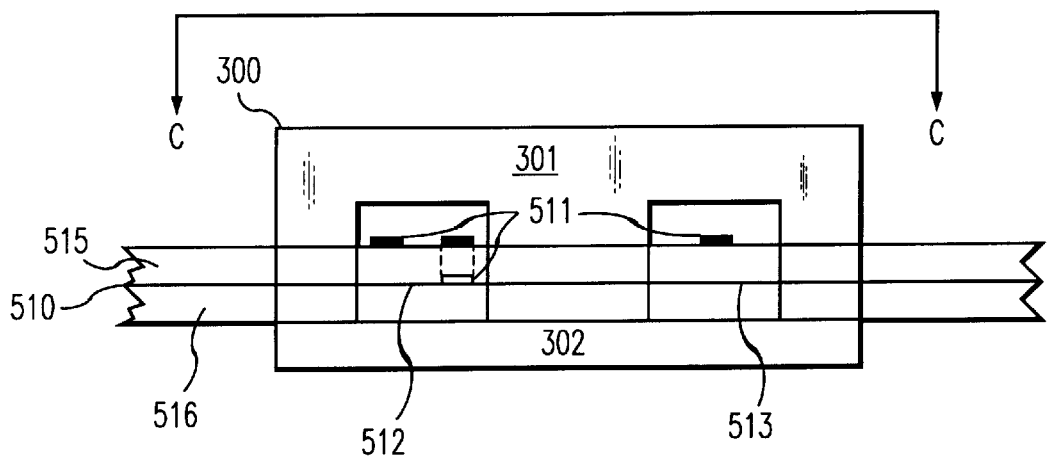
FIG. 6 is a cross-sectional view of the equalizer of FIG. 5.

FIGS. 5 and 6 show the equalizer 300 being used in conjunction with a multi-layer PC board 510 to define a triple-pass routing pattern. Equalizer 300 is mounted to PC board 510 in the same manner as to a single-layer PC board as shown in FIGS. 3 and 4. A stripline 511 is routed by layers 515 and 516 in a loop pattern that winds through both tunnels 306 and 307 in opposite directions, once through tunnel 307 and twice through tunnel 306. Any portion of stripline 511 extending through tunnels 306 and 307 may be defined by any layer 515 and 516. Both stripline 511 and all layers 515 and 516 of the portions 512 and 513 of PC board 510 which route stripline 511 in opposite directions extend through tunnels 306 and 307 and are surrounded by equalizer 300. For multi-pass routing patterns, the stripline is merely looped through the tunnels more times. Equalizer 300 of FIGS. 5 and 6 is tuned within a range of frequencies by varying the number of passes that the stripline makes though the tunnels.

Figure 7:
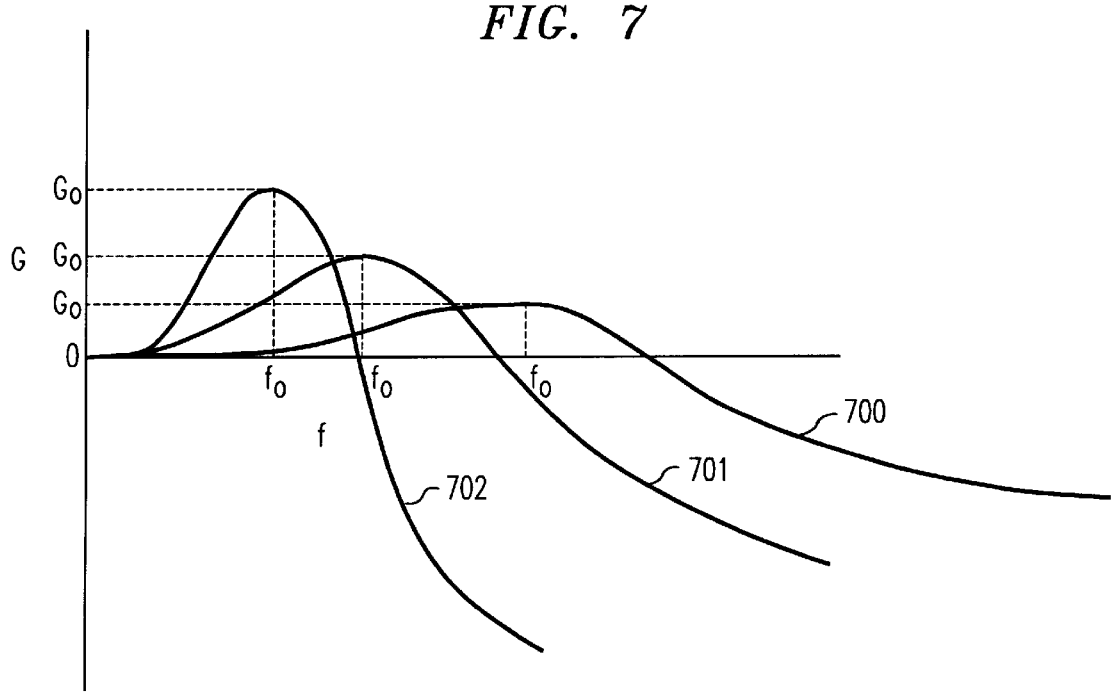
FIG. 7 is a graph showing the gain vs. frequency response characteristics of the equalizer embodiments of FIGS. 1, 3, and 5.

FIG. 7 shows the typical relative gain (G)-vs.-frequency (f) response characteristics of the equalizers 100 and 300 and show the effect thereon of the single-pass, double-pass, and triple-pass routing patterns of FIGS. 1, 3, and 5. The frequency is indicated in megahertz (MHz), and the gain is indicated in decibels (dB) in FIG. 7. Curve 700 shows the characteristic exhibited by equalizer 100 utilizing the single-pass routing pattern of FIG. 1; curve 702 shows the characteristic exhibited by equalizer 300 utilizing the double-pass routing pattern of FIG. 3; and curve 702 shows the characteristic exhibited by equalizer 300 utilizing the triple-pass routing pattern of FIG. 5.

Two quantities associated with these responses are the gain-peak frequency ($f_o$) and gain-peak value ($G_o$). In general, the larger the value of $G_o$ and $f_o$, the larger the bit-rate (bandwidth) that the equalizer can support. The shape of the curves shown in FIG. 7 is important to the operation of the passive-gain equalizer. This frequency response can be tuned to different discrete values of $G_o$ and $f_o$ by properly configuring the system. The typical configurations envisioned are the single-pass, double-pass, triple-pass, etc. As the number of passes increases, the value of $G_o$ increases and the value of $f_o$ decreases for a given ferrite material. This implies a constant gain-bandwidth product for all configurations. $G_o$ increases as the number of passes increases because of the transforming action provided by the planar magnetic structure of the equalizer. The transforming action increases as the number of passes increases. The value of $f_o$ decreases as the number of passes increases because $f_o$ is inversely proportional to the square root of the aggregate inductance (L) provided by the magnetic structure of the equalizer. The aggregate inductance increases as the number of passes increases.

It is desirable to have the gain equalizer function as a low-pass filter, i.e., to have a sharp frequency cut-off characteristic for high signal frequencies. But, as FIG. 7 shows, the lower is the number of passes in the routing pattern, the lesser is the slope of the characteristic curve within the transition region (frequencies above $f_o$). This problem is especially manifested by the single-pass and double-pass configurations—characteristic curves 700 and 701. However, the single- and double-pass configurations are very attractive because the required stripline routing patterns do not require the use of multiple stripline routing layers within the PC board. In order to make the single- and double-pass configurations more attractive, the slopes of their frequency response transition regions must be increased.

Figure 8:
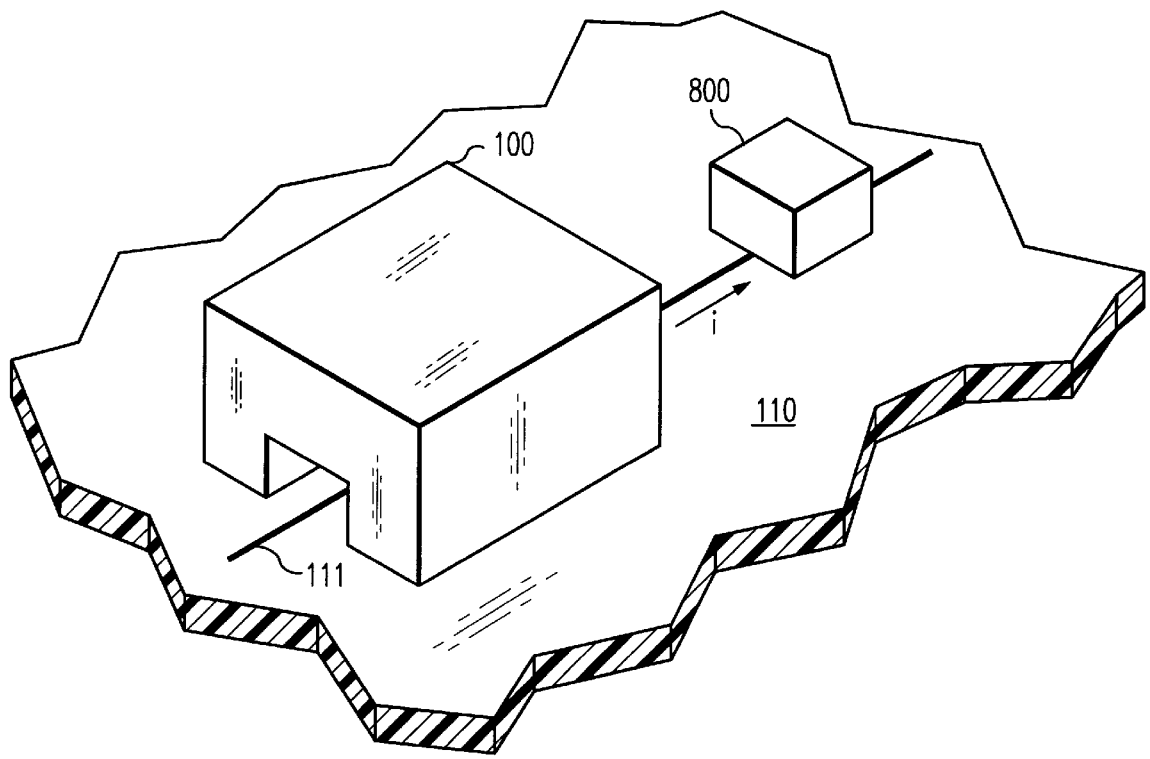
FIG. 8 is a perspective view of a fourth embodiment of a PC board-mounted passive-gain equalizer constructed according to the invention.
Figure 9:
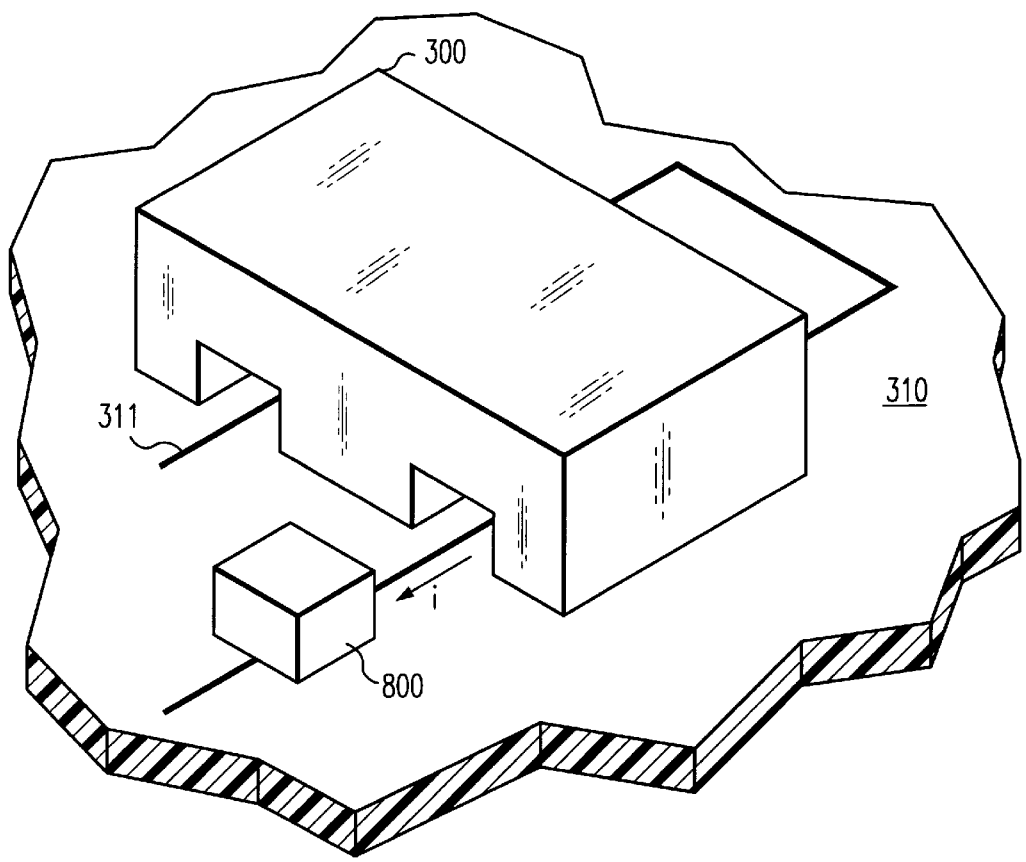
FIG. 9 is a perspective view of a fifth embodiment of a PC board-mounted passive-gain equalizer constructed according to the invention.
Figure 10:
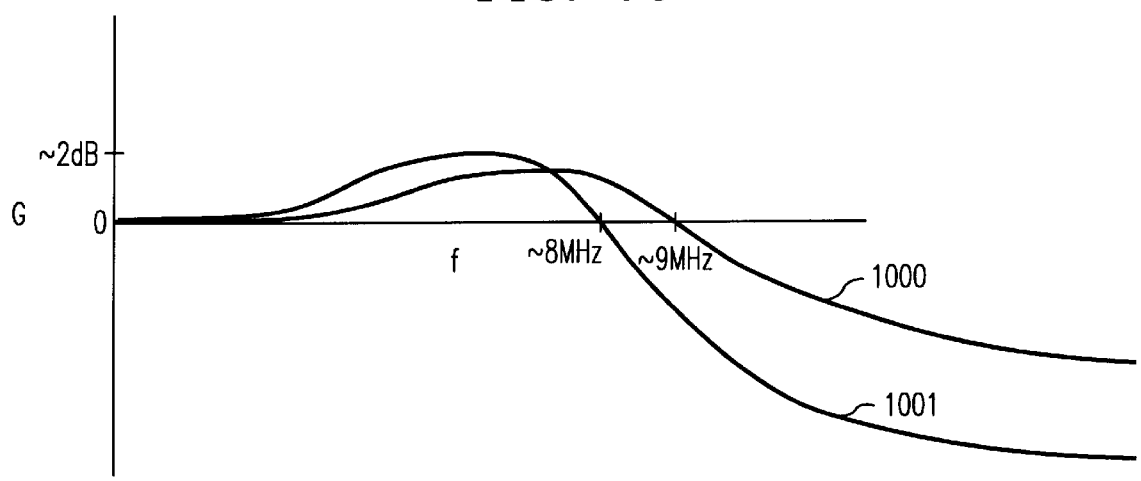
FIG. 10 is a graph showing the gain vs. frequency response characteristics of illustrative equalizer embodiments of FIGS. 1 and 8.
Figure 11:
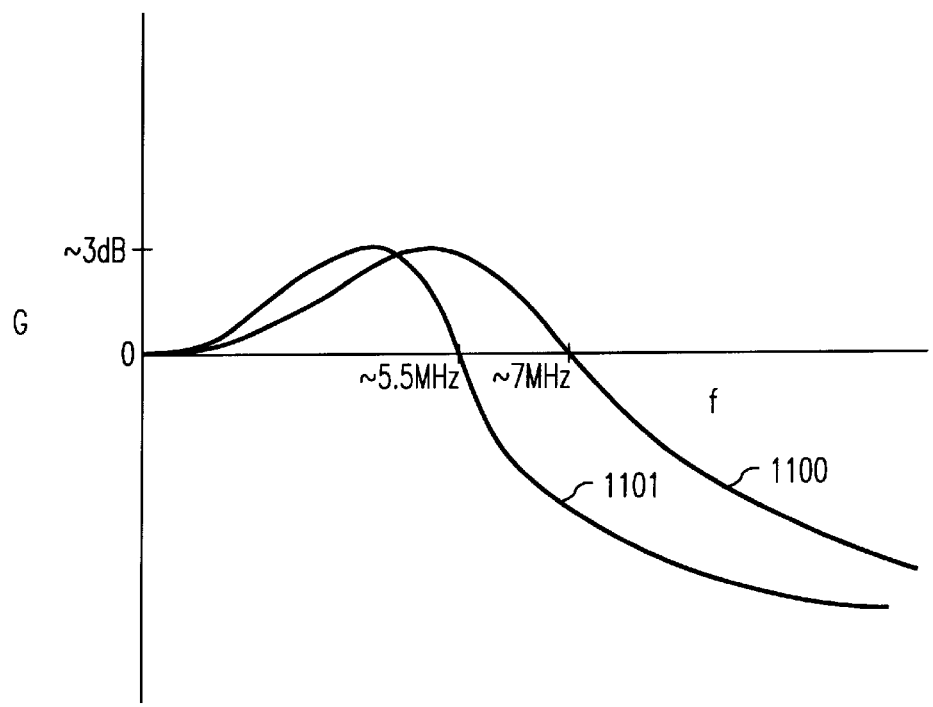
FIG. 11 is a graph showing the gain vs. frequency response characteristics of illustrative equalizer embodiments of FIGS. 3 and 9.

This is accomplished by immediately following the equalizer structures of FIGS. 1–2 or 3–4 with a ferromagnetic electromagnetic-interference (EMI) filter or choke 800, as shown in FIGS. 8 and 9. Various types of EMI filters are well known in the art. Alternatively, EMI filter 800 may be one of the devices described in copending application of G. Carter et al. entitled "Printed-Circuit Board-Mountable Ferrite EMI Filter", Ser. No. 08/795,431, filed on even date herewith, now U.S. Pat. No. 5,801,597, and assigned to the same assignee. Preferably, EMI filter 800 is made of a nickel-zinc (NiZn) material. NiZn has a constant frequency response for frequencies up to about 10 MHz, whereas for frequencies above 10 MHz, the slope of its transition region is quite steep. It is exactly this characteristic that enables the slope of the transition regions for the single- and double-pass configurations to be significantly improved, while, for the most part, not affecting the frequency response for frequencies below 10 MHz. The equalizer structure 100 or 300 can be either NiZn or manganese-zinc (MnZn). FIGS. 10 and 11 show experimentally-measured frequency response curves for an equalizer made of a particular MnZn material (3F4) of Phillips Components. FIG. 10 shows the frequency response curves for the single-pass configuration without filter 800 (curve 1000) and with filter 800 (curve 1001). FIG. 11 shows the frequency response curves for the double-pass configuration without filter 800 (curve 1100) and with filter 800 (curve 1101). The slope of the transition region portion of the frequency response is improved by about 3 dB for both the single-pass and double-pass configurations.

Because of the looping routing pattern of configurations having more than two passes—see, for example, FIG. 5—the stripline typically must eventually cross itself. This may necessitate the use of multiple stripline routing layers within the PC board. (An alternative to using either a multi-layer or a double-sided PC board is to use jumpers—bridge-like conductors—to effect the crossing. However, the use of jumpers typically requires hand assembly, and therefore is not favored.) Multi-layer and double-sided PC boards are expensive, however. Consequently, use of single-layer single-sided PC boards is favored. It is therefore desirable to design a passive-gain equalizer having more than two passes—or having the performance of an equalizer having more than two passes—which can be used with single-layer single-sided PC boards.

Figure 13:
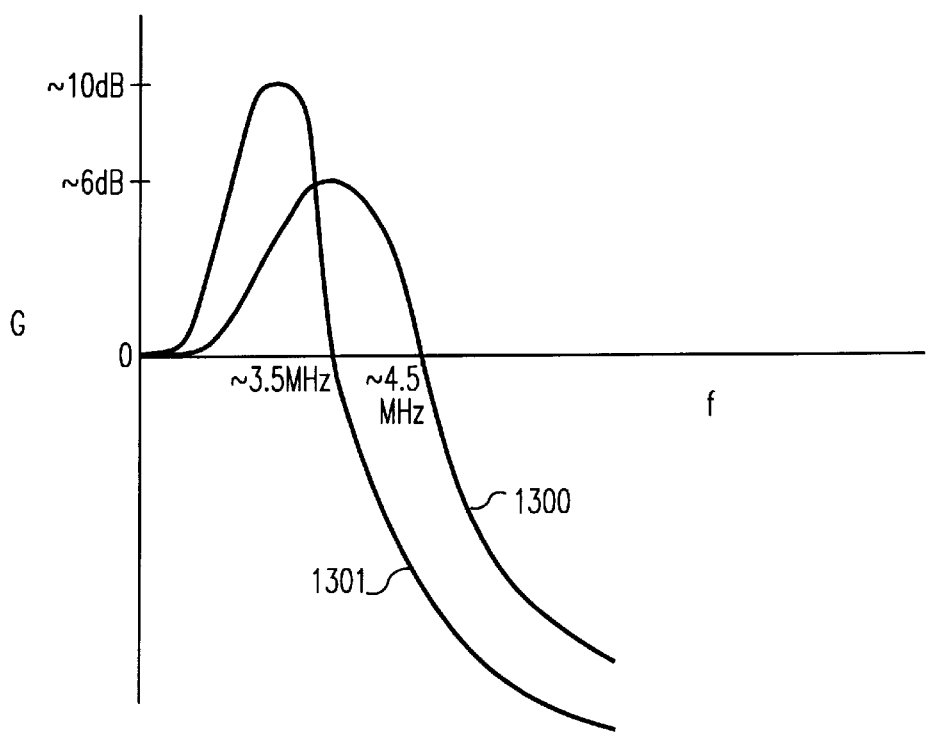
FIG. 13 is a graph showing the gain vs. frequency response characteristics of an illustrative equalizer embodiment of FIG. 12 and an illustrative equalizer embodiment configured according to the principles of FIG. 5.
Figure 12:
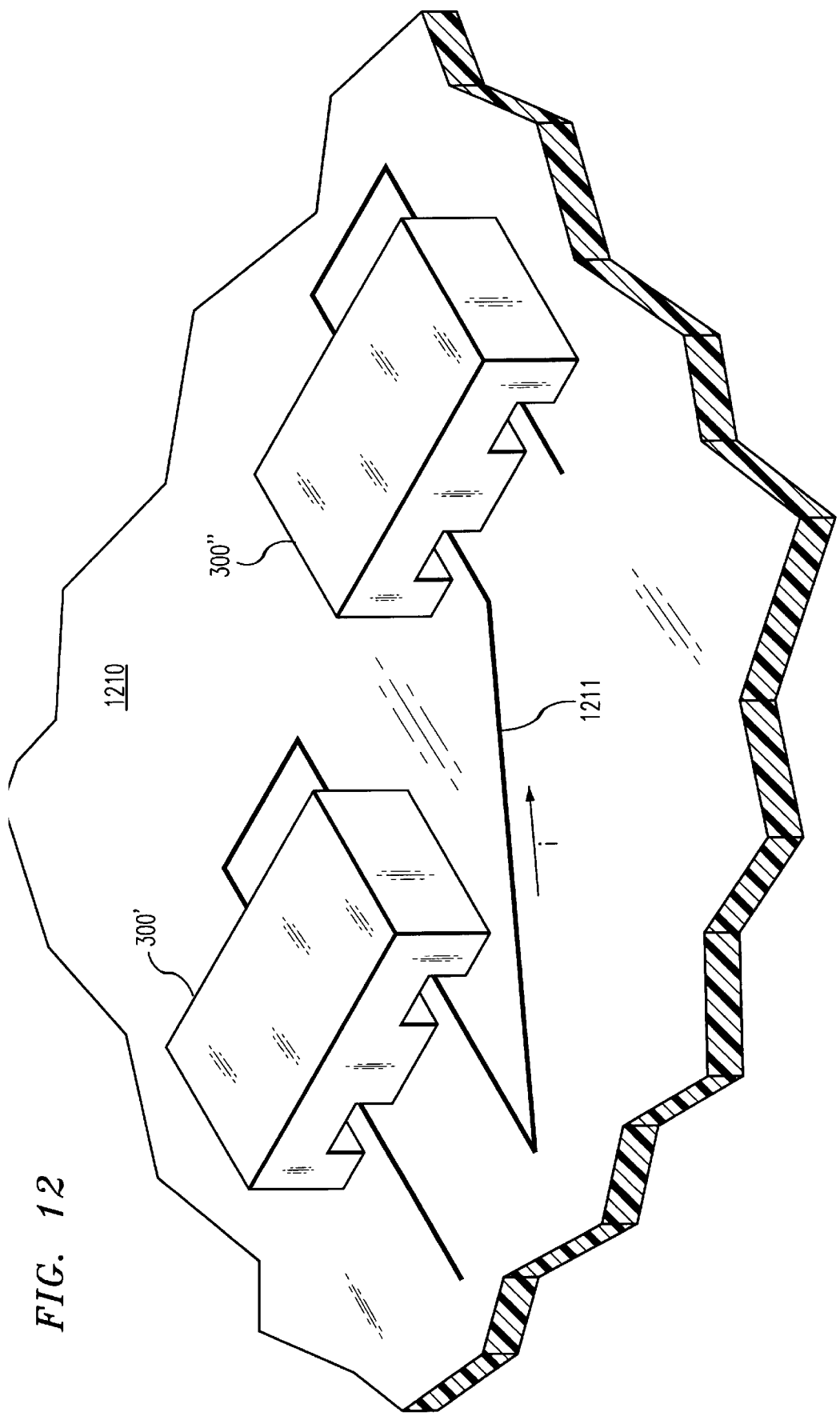
FIG. 12 is a perspective view of a sixth embodiment of a PC board-mounted passive-gain equalizer constructed according to the invention.

This desired effect can be achieved with an equalizer that comprises a cascade of two or more equalizers 300' and 300" (each one of which is a duplicate of the equalizer 300 of FIG. 3) and step-function type stripline 1211 routing patterns defined by PC board 1210, as shown in FIG. 12. The step-function type routing pattern is important to the effectiveness of the proposed arrangement. As was stated previously, the equalizers can be made of either nickel-zinc (NiZn) or manganese-zinc (MnZn) materials. FIG. 13 shows the experimentally measured frequency response curves for the cascade of two double-pass equalizers shown in FIG. 12 and made from a particular MnZn material (3F4) of Phillips Components. The tunability of this scheme is achieved by using different ferrite material compositions. Stripline 1211 is routed through each tunnel of each equalizer 300' and 300" in a step-like manner (cascaded double-pass configuration). The performance of this scheme is shown by curve 1300 and is compared to a "four-pass" scheme implemented in the manner described for FIG. 3, whose performance is shown by curve 1301. The four-pass scheme consists of two complete passes of the stripline through each tunnel of a single equalizer 300, and requires the use of either a multi-layer or a double-sided PC board. An important observation is that the bandwidth of the cascaded double-pass scheme is increased by about 1 MHz relative to the four-pass scheme, while the gain-peak is reduced from about 10 to about 6 dB. This implies a tradeoff in the gain-bandwidth product. The cascaded double-pass scheme can support higher bit-rates than the four-pass scheme.

Of course, various changes and modifications to the illustrative embodiments described above will be apparent to those skilled in the art. These changes and modifications can be made without departing from the spirit and the scope of the invention and without diminishing its attendant advantages. It is therefore intended that such changes and modifications be covered by the following claims.

The invention claimed is:

1. A method of voltage amplitude equalization comprising:

magnetically coupling a low-loss ferrite to a only a single conductor of digital signals defined by a plurality of frequencies, said ferrite defining a tunnel therethrough and having said single conductor extending through the tunnel, the ferrite having no external power source other than said digital signals and attenuating a voltage of some while amplifying a voltage of others of the frequencies to perform passive-gain voltage equalization of the digital signals.

2. An apparatus for voltage amplitude equalization comprising:

a printed circuit board defining a conductor of digital signals defined by a plurality of frequencies; and a low-loss ferrite defining a tunnel therethrough mounted on the PC board and magnetically coupled to only a single said conductor extending through the tunnel, the ferrite having no external power source other than said digital signals and through the magnetic coupling attenuating a voltage of some while amplifying a voltage of others of the frequencies to form a passive-gain voltage equalizer of the digital signals.

3. The apparatus of claim 2 wherein:

the ferrite is a power-transforming ferrite.

4. The apparatus of claim 2 wherein:

the ferrite comprises a ferrite body defining a tunnel therethrough, and the single conductor extends through the body via the tunnel.

5. The apparatus of claim 2 wherein:

the ferrite comprises
- a ferrite body defining a tunnel therethrough, and
- both a portion of the PC board and the conductor, defined by the portion of the PC board, extend therethrough.

6. The apparatus of claim 5 wherein:

the PC board defines a pair of holes therethrough from one side to another side thereof; and the ferrite body comprises
- a substantially "C"-shaped first ferrite body portion positioned on the one side of the PC board and defining a pair of legs extending through the holes defined by the PC board to the other side of the PC board, and
- a second ferrite body portion spanning the legs on the other side of the PC board.

7. The apparatus of claim 4 wherein:

the ferrite further comprises
- a ferrite choke mounted on the PC board and coupled to the conductor at an output of the digital signals from the ferrite body.

8. The apparatus of claim 2 wherein:

the ferrite comprises
- ferrite body defining at least a pair of substantially parallel tunnels therethrough and having the single conductor extend at least once through each of the tunnels, the single conductor extending in opposite directions through adjacent said tunnels and the single conductor extending always in a same direction through each tunnel.

9. The apparatus of claim 8 wherein:

the PC board defines a trio of holes therethrough from one side to another side thereof; and the ferrite body comprises
- a substantially "E"-shaped first body portion positioned on the one side of the PC board and defining a trio of legs extending through the trio of holes defined by the PC board to the other side of the PC board, the holes positioned such that the conductor conducts the digital signals in one direction between the holes for one pair of the legs and in an opposite direction between the holes for another pair of the legs, the pairs of legs having a leg in common, and
- a second ferrite body portion spanning the legs on the other side of the PC board.

10. The apparatus of claim 8 wherein:

the conductor forms substantially a "U" shape between the pair of tunnels.

11. The apparatus of claim 8 comprising:

a plurality of said ferrite bodies mounted on the PC board and interconnected by the conductor extending through all said tunnels of each said ferrite body and extending through all said tunnels of any one said ferrite body before extending through any said tunnel of any other said ferrite body.

12. The apparatus of claim 8 wherein:

the ferrite further comprises
- a ferrite choke mounted on the PC board and coupled to the conductor at a final output of the digital signals from the ferrite body.

13. The apparatus of claim 2 wherein:

the equalization is tuned by varying a length of a portion of the conductor which portion electromagnetically interacts with the ferrite.

14. The apparatus of claim 2 wherein:

the equalization is tuned by varying a number of segments of the conductor which segments electromagnetically interact with the ferrite.

15. The apparatus of claim 4 wherein:

the equalization is tuned by varying a length of the tunnel.

16. An apparatus for a voltage amplitude equalization comprising:

- a printed circuit (PC) board defining a conductor of digital signals defined by a plurality of frequencies;
- a low-loss ferrite body defining a tunnel therethrough, mounted on the PC board and having only a single said conductor extending through the tunnel, the ferrite body being magnetically coupled to the single conductor and through the magnetic coupling unevenly affecting voltages of different said frequencies to form a voltage amplitude equalizer of the digital signals.

17. The apparatus of claim 16 wherein:

the ferrite body has no external power source other than said digital signals and attenuates the voltages of some while it amplifies the voltages of others of the frequencies to form a passive-gain said voltage amplitude equalizer of the digital signals.

18. The apparatus of claim 16 wherein:

the ferrite body comprises a power-transforming ferrite material.

19. The apparatus of claim 16 wherein:

the ferrite body has both the conductor and a portion of the PC board that defines the conductor extending through the tunnel.

20. The apparatus of claim 19 wherein:

the PC board defines a pair of holes therethrough from one side to another side thereof; and the ferrite body comprises
- a substantially "C"-shaped first ferrite body portion positioned on the one side of the PC board and defining a pair of legs extending through the holes defined by the PC board to the other side of the PC board, and
- a second ferrite body portion spanning the legs on the other side of the PC board.

21. An apparatus for voltage amplitude equalization comprising:

- a printed circuit (PC) board defining a conductor of digital signals defined by a plurality of frequencies;
- a low-loss ferrite body defining at least a pair of substantially parallel tunnels therethrough, mounted on the PC board and having only a single said conductor extending at least once through each of the tunnels, the single conductor extending in opposite directions through adjacent said tunnels and the single conductor extending always in a same direction through each tunnel, the ferrite body being magnetically coupled to the single conductor and through the magnetic coupling unevenly affecting voltages of different said frequencies to form a voltage amplitude equalizer of the digital signals.

22. The apparatus of claim 21 wherein:

the ferrite body has no external power source other than said digital signals and attenuates the voltages of some while it amplifies the voltages of others of the frequencies to form a passive-gain voltage amplitude equalizer of the digital signals.

23. The apparatus of claim 21 wherein:

the ferrite body comprises a power-transforming ferrite material.

24. The apparatus of claim 21 wherein:

the conductor is defined by a first and a second portion of a PC board, and the ferrite body has both the conductor and the first portion extending through one of the tunnels and both the conductor and the second portion extending through another of the tunnels.

25. The apparatus of claim 24 wherein:

the PC board defines a trio of holes therethrough from one side to another side thereof; and the ferrite body comprises a substantially "E"-shaped first body portion positioned on the one side of the PC board and defining a trio of legs extending through the trio of holes defined by the PC board to the other side of the PC board, and a second ferrite body portion spanning the legs on the other side of the PC board.

26. The apparatus of claim 24 wherein:

the conductor forms substantially a "U"-shape between the pair of tunnels.

27. The apparatus of claim 24 comprising:

a plurality of said ferrite bodies mounted on the PC board and interconnected by the conductor extending through all said tunnels of each said ferrite body and extending through all said tunnels of any one said ferrite body before extending through any said tunnel of any other said ferrite body.

* * * * *